(12) United States Patent
Gagne et al.

(10) Patent No.: US 8,729,950 B2
(45) Date of Patent: May 20, 2014

(54) HIGH VOLTAGE CLAMP CIRCUIT

(75) Inventors: Nickole Gagne, Saco, ME (US); Steven Macaluso, Scarborough, ME (US); Jani Kauppinen, Kiiminki (FI)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/483,914

(22) Filed: May 30, 2012

(65) Prior Publication Data

US 2013/0321055 A1    Dec. 5, 2013

(51) Int. Cl.
*H03L 5/00*    (2006.01)
(52) U.S. Cl.
USPC .......................................... 327/309; 327/321
(58) Field of Classification Search
USPC .................. 327/306, 321–323, 309
See application file for complete search history.

(56) References Cited

U.S. PATENT DOCUMENTS

| | | | |
|---|---|---|---|
| 5,500,616 A | 3/1996 | Ochi | |
| 6,465,996 B2 * | 10/2002 | Nagata et al. | 323/303 |
| 6,693,469 B2 | 2/2004 | Prodanov | |
| 7,145,364 B2 | 12/2006 | Bhattacharya et al. | |
| 7,256,640 B2 | 8/2007 | Ucciardello et al. | |
| 7,274,543 B2 | 9/2007 | Nishikawa et al. | |
| 7,359,171 B2 * | 4/2008 | Yoshida | 361/93.9 |
| 2008/0273391 A1 | 11/2008 | Steedman et al. | |

* cited by examiner

*Primary Examiner* — Dinh T. Le
(74) *Attorney, Agent, or Firm* — Schwegman, Lundberg & Woessner, P.A.

(57) ABSTRACT

This document discloses, among other things, a voltage clamp circuit where an output voltage equals an input voltage for at least a portion of a first range of input voltages, and where the output voltage is less than the input voltage for at least a portion of a second range of input voltages.

18 Claims, 6 Drawing Sheets

HIGH VOLTAGE CLAMP CIRCUIT

BACKGROUND

A circuit that prevents an output voltage from exceeding a certain voltage level is referred to as a voltage clamp circuit. A voltage clamp circuit can be useful in regulator applications where a higher voltage source is converted to a lower voltage in order to supply voltage to a low voltage device. The voltage clamp circuit can provide overvoltage protection to the low voltage device by "clamping" the output voltage at a safe operating level.

OVERVIEW

This disclosure describes, among other things, systems and methods that limit an output voltage of a circuit without causing a threshold voltage drop through a controllable switch at a lower voltage supply range, e.g., input voltages less than the reverse breakdown voltage of a zener diode connected between input terminals. Using the techniques of this disclosure, the output voltage generally tracks the input voltage at the lower voltage supply range, thereby increasing the output voltage magnitude of the clamp circuit in this voltage range. More headroom increases the operating range of circuits that use the clamped output voltage as a supply voltage.

In one example implementation of the techniques of this disclosure, a voltage clamp circuit includes a first controllable switch connected between an input terminal and an output terminal, the first controllable switch configured to control an output voltage at the output terminal for a first range of input voltages at the input terminal, and a second controllable switch connected between the input terminal and the output terminal, the second controllable switch configured to control the output voltage at the output terminal for a second range of input voltages at the input terminal, where the second range of input voltages is greater than the first range of input voltages, where the output voltage equals the input voltage for at least a portion of the first range of input voltages, and where the output voltage is less than the input voltage for at least a portion of the second range of input voltages.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, techniques that can increase the headroom of clamping circuits at the lower voltage supply range, e.g., input voltages less than the reverse breakdown voltage of a zener diode connected between input terminals. Using the techniques of this disclosure, a clamp circuit does not drop a threshold voltage at its output at the lower voltage supply range, as described in more detail below.

Figure 1:
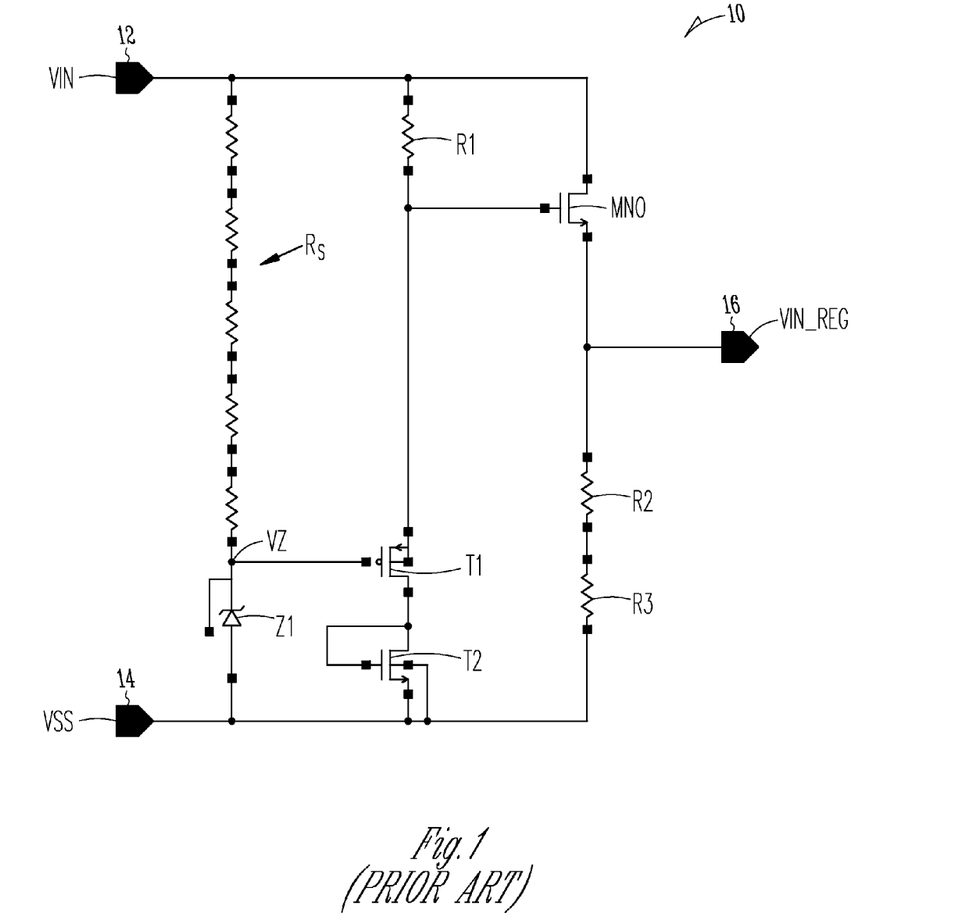
FIG. 1 depicts a PRIOR ART voltage clamp circuit diagram.

FIG. 1 depicts a PRIOR ART voltage clamp circuit diagram, shown generally at 10. The clamp circuit 10 includes input terminals 12, 14 and output terminal 16. The input terminal 12 can receive an input voltage (Vin), the input terminal 14 can receive a reference voltage (Vss) (e.g., ground), and the clamp circuit 10 of FIG. 1 can generate an output voltage (Vin_reg) at the output terminal 16. At lower supply voltage ranges, as the input voltage increases, the output voltage at the output terminal 16 also increases. The clamp circuit 10 of FIG. 1, however, can ensure that once the input voltage reaches a particular voltage level, the output voltage will no longer increase with any further increases in the input voltage. The output voltage can be "clamped" at a voltage that is less than that particular voltage level.

The clamp circuit 10 of FIG. 1 can include a zener diode Z1 in series with a resistor stack $R_s$. The following description of FIG. 1 describes two scenarios: (1) when the input voltage is less than the reverse breakdown voltage of the zener diode Z1; and (2) when the input voltage is greater than the reverse breakdown voltage of the zener diode Z1.

The zener diode Z1 generally does not leak current until the voltage on the node labeled "$V_z$" (e.g., between the zener diode Z1 and the resistor stack $R_s$) is greater than the reference voltage by a reverse breakdown voltage of the zener diode Z1 (e.g., about 5.2 volts (V)). As long as the input voltage is below the reverse breakdown voltage of the zener diode Z1 (e.g., about 5.2 V in one example implementation), the voltage on the node $V_z$ can be approximately equal to the input voltage because there is no current through the resistor stack $R_s$ and thus no voltage drop across the resistor stack $R_s$.

The clamp circuit 10 of FIG. 1 can further include two transistors T1, T2. The voltage on a node $V_z$ between the resistor stack $R_s$ and the zener diode Z1 (e.g., the input voltage, when the voltage on the cathode of the zener diode Z1 is less than the breakdown voltage of the zener diode Z1) can be applied to the gate terminal of the transistor T1 (e.g., a p-type field-effect transistor (FET)). In the example configuration shown in FIG. 1, the transistor T1 can be configured as a source-follower and can be in series with the transistor T2 (e.g., an n-type FET), which can be configured as a diode. A negative gate-source voltage (Vgs) can place the transistor T1 in an ON-state (e.g., a "low" impedance state). Because the voltage on the gate terminal of the transistor T1 is approximately equal to the input voltage, the transistor T1 remains in an OFF-state (e.g., a "high" impedance state).

The clamp circuit 10 can further include a controllable switch MN0 and a resistor R1 in series with the transistor T1. In one example, the controllable switch MN0 can be a transistor (e.g., an n-type FET). In other examples, the controllable switch can be another type of transistor or controllable switch. The resistor R1 can be connected to the input voltage and the gate, or control, terminal of the controllable switch MN0.

The drain terminal of the transistor MN0 can be connected to the input voltage. In an example, when the transistor T1 is in an OFF-state, little to no current is drawn through the resistor R1. Thus, in this example, the voltage at the gate terminal of the transistor T1 is approximately equal to the input voltage, the transistor MN0 can be configured as a source follower, and to operate within its linear region, a threshold voltage (Vt) (e.g., about 0.6 V to about 1 V), can be dropped across the transistor MN0.

The clamp circuit 10 can further include resistors R2, R3. In an example, the resistors R2, R3 can be used to place the output voltage in a known state when there is no input voltage so that the output terminal does not enter a high impedance state. The transistor MN0, which can require a positive Vgs to operate, can turn to an ON-state and the output voltage can be approximately equal to the input voltage minus the threshold voltage of MN0 (e.g., about 0.6 V to about 1 V). For example, when the transistor MN0 is placed in an ON-state, an input voltage of 4 V can result in an output voltage as low as about 3 V due to the threshold voltage drop across the transistor MN0.

When the input voltage exceeds the reverse breakdown voltage of the zener diode Z1, the zener diode Z1 can begin to conduct current and, as such, a voltage drop can occur across the resistor stack $R_s$. Thus, the voltage at the cathode of the zener diode Z1 is no longer equal to the input voltage; it is a voltage that is less than the input voltage and is dependent upon the resistance of the resistor stack $R_s$ and the characteristics of the zener diode Z1.

As the voltage at the cathode of the zener diode Z1 drops with respect to the input voltage, the voltage at the cathode of the zener diode Z1 can begin to bias the transistor T1, which can limit the voltage on the gate terminal of the transistor MN0 as a voltage drop occurs across the resistor R1. As the voltage drop occurs across the resistor R1, the transistor MN0 turns to an ON-state and controls the output voltage. It should be noted that the transistor T2 can be configured as a diode in order to increase the voltage at the drain terminal of the transistor T1 by a diode voltage (e.g., about 0.7 V), which can help prevent the transistor T1 from entering its cutoff region.

In the manner described above, the clamp circuit 10 of FIG. 1 can act as traditional regulator. By way of specific example, the clamp circuit 10 of FIG. 1 can convert an input voltage (Vin) of 10 V to an output voltage (Vin_reg) of 5 V. As another example, the clamp circuit 10 of FIG. 1 can convert a high input voltage of 28 V to an output voltage of 5 V.

One disadvantage of the clamp circuit 10 shown in FIG. 1 is its operation in the lower voltage supply range (e.g., input voltages less than the reverse breakdown voltage of the zener diode Z1). As indicated in the example above, an input voltage of 4 V can result in an output voltage as low as about 3 V due to the threshold voltage dropped across the transistor MN0. Such a drop in the output voltage can result in a loss of headroom and thus a loss in functionality.

In contrast, in certain examples, using the techniques of this disclosure, a threshold voltage may not be dropped at the lower voltage supply range, e.g., less than about 5 V. As described in more detail below with respect to FIG. 2, the output voltage can generally track the input voltage at the lower voltage supply range, which can increase the headroom of the circuit. An increase in headroom can increase the operating range of circuits that use the clamped output voltage as a supply voltage.

Figure 2:
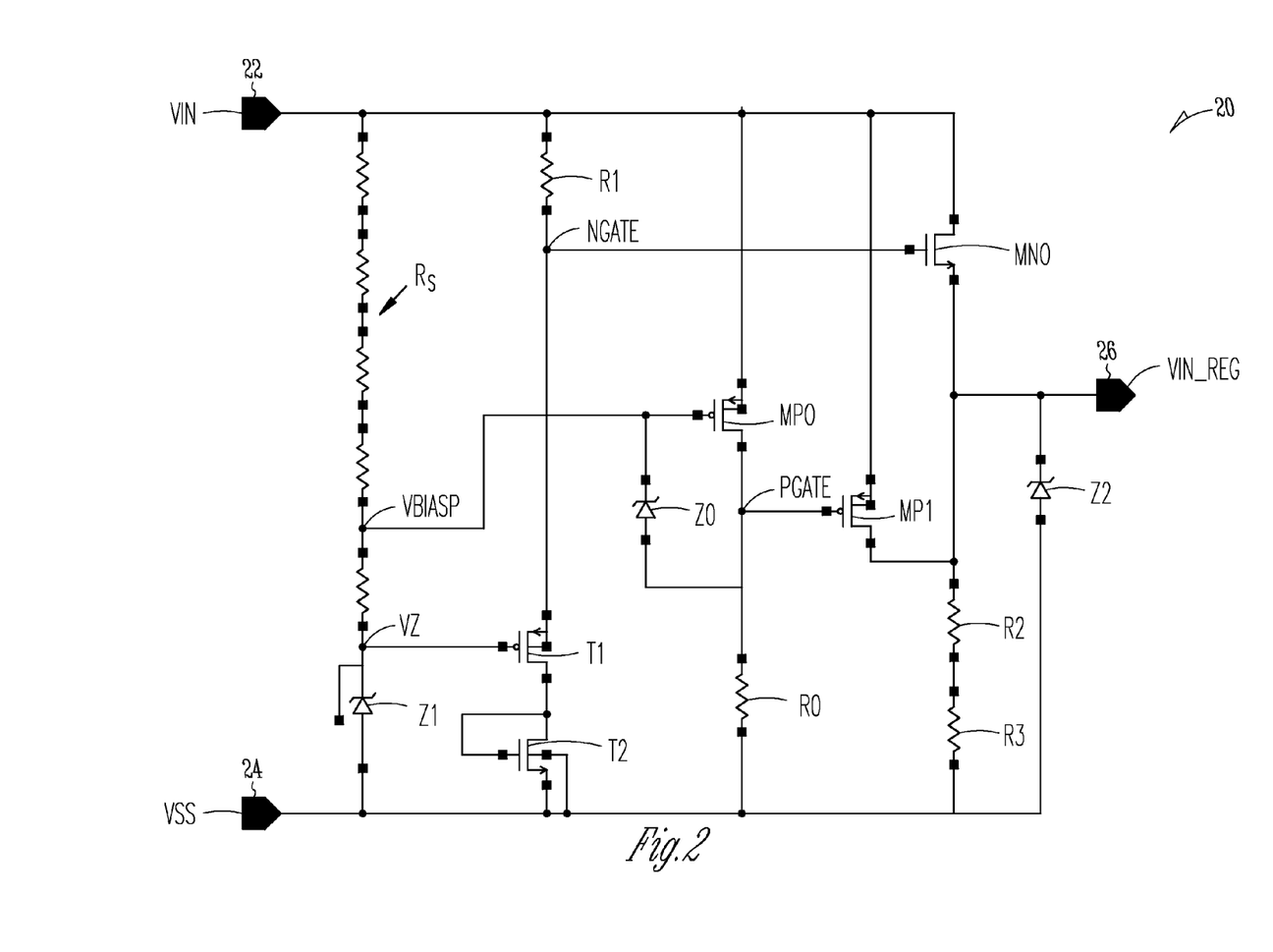
FIG. 2 depicts an example voltage clamp circuit diagram that can implement various techniques in accordance with this disclosure.

FIG. 2 depicts an example voltage clamp circuit diagram that can implement various techniques in accordance with this disclosure. The example clamp circuit 20 can include input terminals 22, 24, an output terminal 26, and two controllable switches, namely MP0 and MP1. The controllable switch MP1 is connected between the input terminal 22 and the output terminal 26 and the controllable switch MP0 is connected between the input terminal 22 and the controllable switch MP1.

The clamp circuit 20 can further include either or both of zener diodes Z0, Z2. In one example, the two controllable switches MP0, MP1 can be high voltage drain-source tolerant p-type FETs (e.g., metal-oxide-semiconductor field-effect transistors (MOSFETs)). In other example configurations, the controllable switches MP0, MP1 can be other types of transistors or switches.

In addition, the circuit 20 can include a controllable switch MN0. In one example, the controllable switch MN0 can be a transistor (e.g., an n-type FET). In other examples, the controllable switch can be another type of transistor or switch.

An input voltage (Vin) can be applied across the input terminals 22, 24 and the clamp circuit 20 of FIG. 2 can generate an output voltage (Vin_reg) at the output terminal 26. The terminal 24 can be at a ground voltage (e.g., about 0 V). At input voltages below a particular voltage level, as the input voltage increases, the output voltage at the output terminal 26 can also increase. The clamp circuitry 20 of FIG. 2, like the circuit 10 shown in FIG. 1, can ensure that once the input voltage reaches the particular voltage level, the output voltage will no longer increase with any further increases in the input voltage.

The clamp circuit 20 of FIG. 2 can also include a zener diode Z1 in series with a resistor stack $R_s$. The clamp circuit further includes a node labeled "$V_z$" (e.g., a node between the zener diode Z1 and the resistor stack $R_s$) and a node labeled "vbiasp" (e.g., a node between two resistors (not labeled) of the resistor stack $R_s$). The zener diode Z1 generally does not leak current until the voltage on the node labeled "$V_z$" is greater than the reference voltage by a reverse breakdown voltage of the zener diode Z1 (e.g., about 5.2 V).

If the input voltage is less than the reverse breakdown voltage of zener diode Z1, the voltage on the node $V_z$ can be approximately equal to the input voltage. In addition, the voltage on the node vbiasp, which can be connected to the gate, or control, terminal of the transistor MP0, can be approximately equal to the input voltage. Thus, the gate terminal and the source terminal of the transistor MP0 can be approximately equal to the input voltage and, as such, there is no gate-source voltage on the transistor MP0, and the transistor MP0 is therefore in an OFF-state.

The clamp circuit 20 of FIG. 2 can further include two transistors T1, T2. The voltage on the node $V_z$ (the input voltage) can be applied to the gate terminal of the transistor T1 (e.g., a p-type FET). In the configuration shown in FIG. 2, the transistor T1 can be configured as a source-follower and can be in series with the transistor T2 (e.g., an n-type FET), which can be configured as a diode. As a p-type FET, a negative gate-source voltage (Vgs) can be used to turn the transistor T1 to an ON-state. Because the voltage on the node $V_z$ can be approximately equal to the input voltage, the voltage on the gate terminal of the transistor T1 is approximately equal to the input voltage, and the transistor T1 remains in an OFF-state.

The clamp circuit 20 can also include a resistor R0 in series with the transistor MP0 and connected to the input terminal 24. The resistor R0 and the transistor MP0 can be connected by a node "pgate." The resistor R0 can pull the node "pgate" to a ground voltage (e.g., about 0 V). In response, the transistor MP1 (e.g., a p-type FET) can turn to an ON-state because the gate, or control, terminal of the transistor MP1 is connected to the node pgate (e.g., at ground voltage) and the source terminal of the transistor MP1 is at the input voltage, resulting in a negative Vgs. The transistor MP1 can apply the input voltage to the output terminal. Thus, the transistor, or controllable switch, MP1 can be configured to control the output voltage at the output terminal 26 for a first range of voltages (e.g., a lower voltage supply range) applied at the input terminal 22. In an example, the output voltage equals the input voltage for at least a portion of the first range of voltages.

The clamp circuit 10 can also include a resistor R1 in series with the transistor T1 and connected to the transistor T1 by a node labeled "ngate." The node ngate can be connected to the gate terminal of the transistor MN0, and the voltage at the node ngate can be approximately equal to the input voltage because the transistor T1 is in an OFF-state. When the transistor MP1 drives the input voltage Vin to Vin_reg, the Vgs is removed from the transistor MN0, thereby turning the transistor MN0 to an OFF-state.

In this manner, and in contrast to the clamp circuit 10 of FIG. 1, for at least a portion of a lower voltage supply range, e.g., input voltages less than the reverse breakdown voltage of the zener diode Z1, the output voltage can equal the input voltage until the input voltage is greater than the reverse breakdown voltage of the zener diode Z1. That is, for at least a portion of the lower voltage supply range, no threshold voltage is dropped across the transistor MP1, in accordance with this disclosure. Rather, as shown and described in more detail below with respect to the graphs of FIGS. 4 and 5, the output voltage generally tracks the input voltage at the lower voltage supply range, which can increase the headroom of circuits that use the output of the clamp circuit 10 as a power supply. More headroom can increase the operating range of circuits that use the clamped output voltage as a supply voltage. For example, using the techniques of this disclosure, an input voltage of 4 V can result in an output voltage of or close to 4 V.

When the input voltage exceeds the reverse breakdown voltage of the zener diode Z1, the zener diode Z1 begins to conduct current and, as such, a voltage is dropped across the resistor stack $R_s$ (which includes at least one resistor) connected in series with the zener diode Z1. Thus, the voltages at nodes $V_z$ and vbiasp are no longer equal to the input voltage; each of these nodes is at a voltage that is less than the input voltage.

Because the gate terminal of the transistor MP0 can be connected to the node vbiasp and the source terminal of the transistor MP0 can be connected to the input voltage, the transistor MP0 has a negative Vgs and therefore turns to an ON-state. Once the transistor MP0 turns to an ON-state, the node pgate can be pulled up to the input voltage and the transistor MP1 turns to an OFF-state because there is no voltage across its gate and source terminals. In other words, when a voltage across the zener diode Z1 exceeds the reverse breakdown voltage, the zener diode Z1 can be configured to conduct current through the resistor stack $R_s$ and apply a voltage at the gate, or control, terminal of the controllable switch MP1.

The voltage at the node $V_z$ turns the transistor T1 to an ON-state. The node "ngate" can be connected to the gate terminal of the transistor MN0, and the voltage at the node "ngate" is less than the input voltage because the transistor T1 is in an ON-state. When the input voltage is greater than the voltage at the node $V_z$ and the transistor MN0 begins to turn to an ON-state, the source terminal of transistor MN0 can be connected to the output. As the transistor MP1 pinches off and stops conducting, the transistor MN0 builds a Vgs either by the input voltage continuing to increase, or by current consumption of the subsequent circuits connected to the output decreasing the output voltage magnitude slightly. Thus, the transistor, or controllable switch, MN0 can be configured to control the output voltage at the output terminal 26 for a second range of voltages that is greater than the first range of voltages applied at the input terminal 22. In an example, the output voltage can be less than the input voltage for at least a portion of the second range of voltages.

A threshold voltage (e.g., about 0.6 V to about 1 V) can be dropped across the transistor MN0 at a higher voltage supply range and, as such, the clamp circuit 20 can behave similar to the circuit of FIG. 1 at higher supply voltages. However, at voltage supply ranges above the reverse breakdown voltage of the zener diode Z1, the threshold voltage drop across the transistor MN0 has less effect on headroom than at lower voltage supply ranges.

In addition, the clamp circuit 20 of FIG. 2 can include a zener diode Z0 to protect the transistor MP0. The zener diode Z0 can be connected between the gate and drain terminals of the transistor MP0. Although the transistor MP0 can be a high voltage device, in some examples, the transistor MP0 can be an asymmetric high voltage device in that it tolerates a high voltage either across its gate and source terminals or across its gate and drain terminals. In such a case, to protect against high voltages across the gate and drain terminals of the transistor MP0, the zener diode Z0 can be connected between the gate terminal and the drain terminal of the transistor MP0. If the gate-drain voltage of the transistor MP0 exceeds a reverse breakdown voltage of the zener diode Z0, then the zener diode Z0 can bias and pull the drain terminal voltage up with the gate voltage to prevent any damage to the transistor MP0.

The clamp circuit 10 can further include resistors R2, R3. The resistors R2, R3 can be used to place the output voltage in a known state when there is no input voltage so that the output terminal does not enter a high impedance state.

The clamp circuit 20 of FIG. 2 can include a zener diode Z2 to protect any devices that are supplied by the output voltage of the clamp circuit 20. The zener diode Z2 can be connected between the output terminal 26 and the ground voltage terminal 24. Depending on the sizing of the resistors and the characteristics of the transistors of the clamp circuit 20, it is possible that the output voltage could overshoot the "clamped" voltage of the circuit during a slow input voltage ramp up, for example. If any overshoot in the output voltage exceeds the reverse breakdown voltage of the zener diode Z2, the zener diode Z2 biases, thereby ensuring that the output voltage of the clamp circuit 20 does not exceed the safe operating range of any devices that are supplied by the clamp circuit. The zener diode Z2 can control a maximum voltage at the output terminal to protect one or more circuits connected to the output of the clamp circuit in the event of an overshoot condition. In this manner, the output voltage can be limited by a reverse breakdown zener voltage so that the high voltage transistor MP1 does not over stress subsequent low voltage devices powered by the output voltage.

Figure 3:
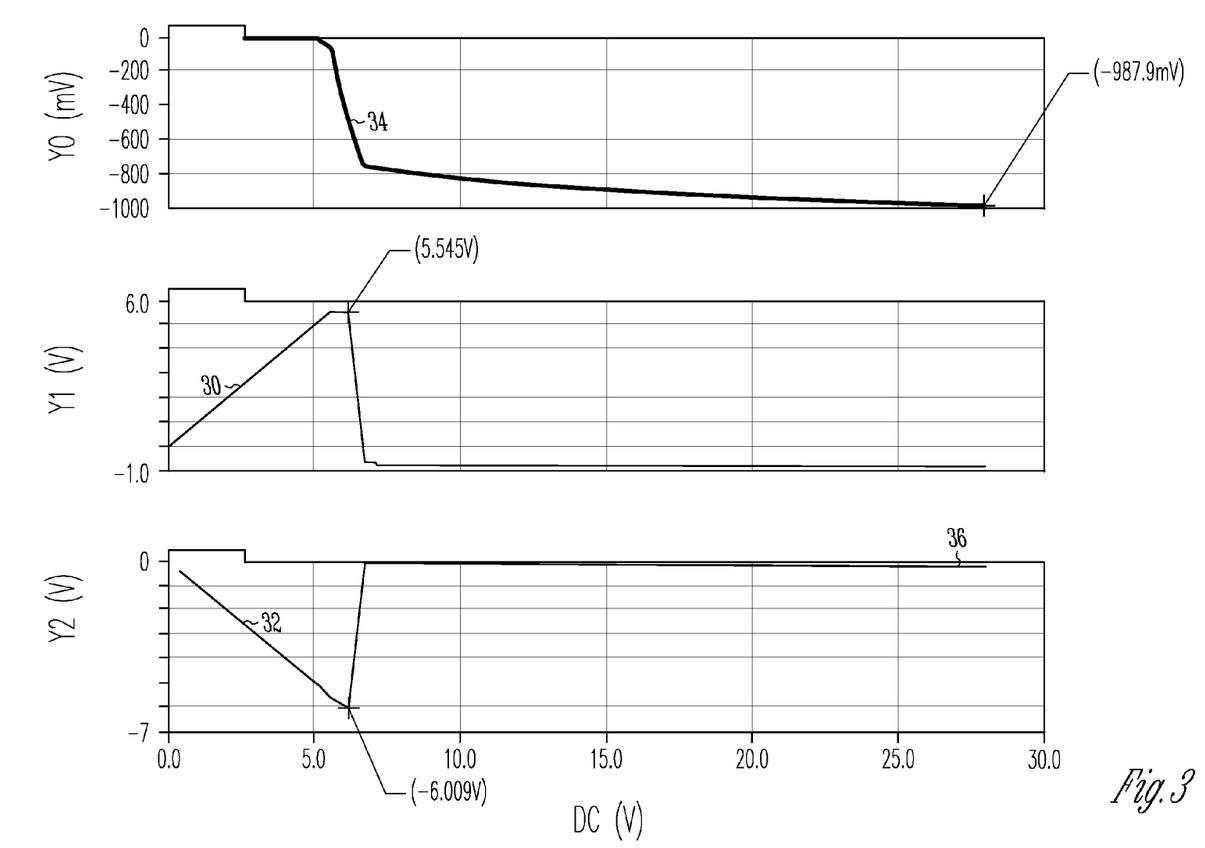
FIG. 3 depicts three graphs related to the operation of the example circuit diagram of FIG. 2.

FIG. 3 depicts three graphs related to the operation of the example circuit diagram of FIG. 2. The top graph in FIG. 3 depicts the gate-source voltage (Vgs) 34 of the transistor MP0 of FIG. 2 with respect to the input voltage. The y-axis represents the voltage in millivolts and the x-axis represents the input voltage in volts. The middle graph depicts the gate-drain voltage (Vgd) 30 of the transistor MP0 of FIG. 2 with respect to the input voltage. The y-axis represents the voltage in volts and the x-axis represents the input voltage in volts. The bottom graph depicts the drain-source voltage (Vds) 32 of the transistor MP0 of FIG. 2 with respect to the input voltage. The y-axis represents the voltage in volts and the x-axis represents the input voltage in volts. The graphs of FIG. 3 will be described together.

As seen in the top graph, Vgs 34 of the transistor MP0 is 0 V initially, so the transistor MP0 is in an OFF-state. Prior to the zener diode Z1 of FIG. 2 biasing, as the input voltage increases, the Vgd 30 and Vds 32 of the transistor MP0 ramp as the input voltage increases, as seen in the middle and bottom graphs of FIG. 3, respectively.

When the input voltage exceeds the reverse breakdown voltage of the zener diode Z1, the Vgs 34 of the transistor MP0 decreases, as seen in the top graph, and the transistor MP0 turns to an ON-state. When the transistor turns to an ON-state, it acts as a switch and thus, the Vds 32 of the transistor MP0 becomes about 0 V, for example, as seen at Vds 36 in the bottom graph. The Vgs of the transistor is about a threshold voltage when the transistor MP0 is in an ON-state.

Figure 4:
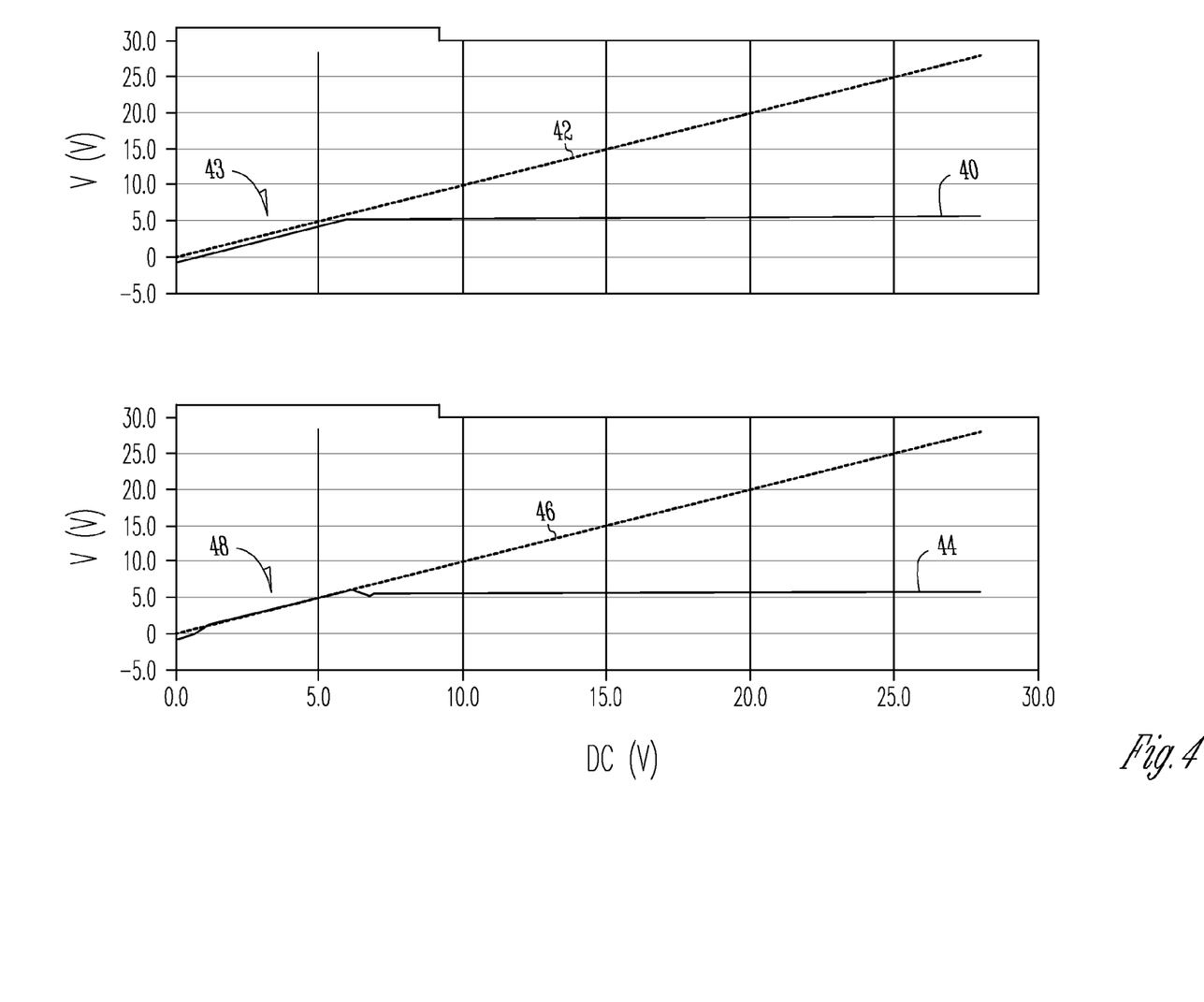
FIG. 4 depicts two graphs that compare the output characteristics of the circuit of FIG. 1 and the example circuit of FIG. 2.

FIG. 4 depicts two graphs that compare the output characteristics of the circuit of FIG. 1 and the example circuit of FIG. 2. The top graph depicts an input voltage 42 and an output voltage 40 of the prior art circuit of FIG. 1. The y-axis represents the output voltage 40 in volts and the x-axis represents the input voltage 42 in volts. The bottom graph depicts the input voltage 46 and the output voltage 44 of the circuit of FIG. 2, in accordance with various techniques of this disclosure. The y-axis represents the output voltage 44 in volts and the x-axis represents the input voltage 46 in volts.

As seen in the top graph, the output voltage 40 is clamped at about 5.5 V when the input voltage 42 is greater than about 6 V. As indicated above, one disadvantage of the clamp circuit shown in FIG. 1 is the operation in the lower voltage supply range. As seen in the top graph in FIG. 4, for input voltages between 0 V and about 6 V (e.g., at 43), the output voltage of the circuit of FIG. 1 is less than the input voltage due to the threshold voltage dropped across the transistor MN0. Such a drop in the output voltage can result in a loss of headroom and thus a loss in functionality.

Using the techniques of this disclosure, however, a threshold voltage is not dropped at the lower voltage supply range. As seen in the bottom graph of FIG. 4, the output voltage 44 is clamped at about 5.5 V when the input voltage 46 is greater than about 6 V. However, unlike the prior art circuit of FIG. 1, the input voltage 46 equals the output voltage 44 for at least a portion of the input voltages between 0 V and about 6 V (e.g., at 48), as seen generally by the overlap in the input and output voltage lines 44, 46 between about 1 V and about 6 V. Thus, the output voltage generally tracks the input voltage at the lower voltage supply range, thereby increasing the output voltage magnitude of the clamp circuit in this voltage range. More headroom can increase the operating range of circuits that use the clamped output voltage as a supply voltage.

Figure 5:
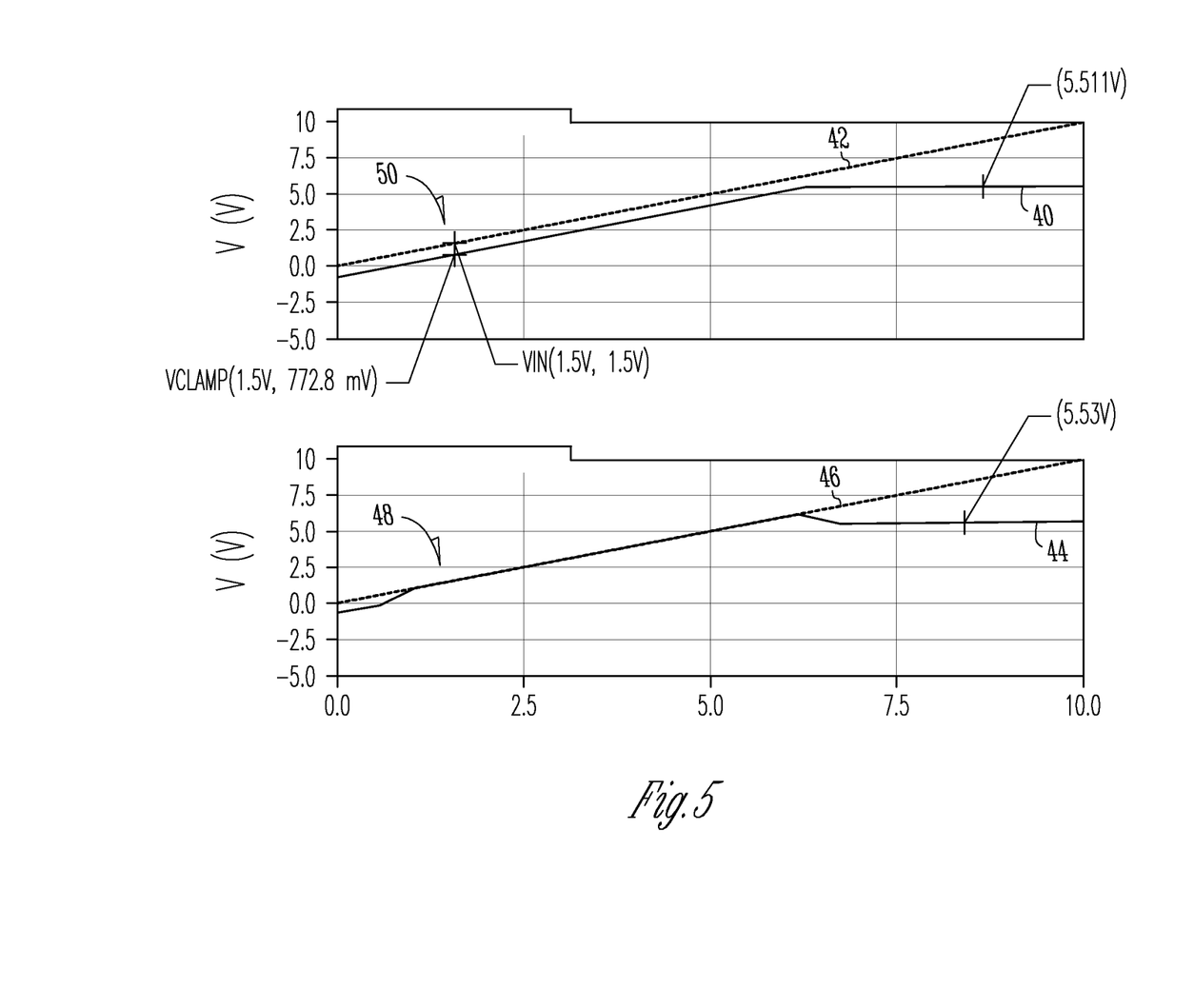
FIG. 5 depicts the two graphs of FIG. 4 in greater detail.

FIG. 5 depicts the two graphs of FIG. 4 in greater detail. The top graph depicts the input voltage 42 and the output voltage 40 of the prior art circuit of FIG. 1. The y-axis represents the output voltage 40 in volts and the x-axis represents the input voltage 42 in volts. The bottom graph depicts the input voltage 46 and the output voltage 44 of the circuit of FIG. 2, in accordance with various techniques of this disclosure. The y-axis represents the output voltage 44 in volts and the x-axis represents the input voltage 46 in volts.

As seen at 50 in the top graph of FIG. 5, for an input voltage 42 ("VIN") of 1.5 V, the output voltage 40 ("VCLAMP") equals 772.8 mV. As such, the headroom has been reduced by about 50%.

Referring now to the bottom graph of FIG. 5, the output voltage 44 equals the input voltage 46 for at least a portion of the range of voltages between 0 V and about 6 V, as shown at 48. That is, in contrast to the prior art techniques (e.g., the circuit of FIG. 1), the output voltage of the circuit 20 of FIG. 2 is not reduced by a threshold voltage in the lower voltage supply range (e.g., 0 V to about 6 V). The output voltage of the circuit of FIG. 2 equals the input voltage for at least a portion of a first range of input voltages, e.g., between 0 V and about 6 V, and the output voltage is less than the input voltage for at least a portion of a second range of input voltages, e.g., between about 6 V and about 10 V, where the second range of input voltages is greater than the first range of input voltages.

Figure 6:
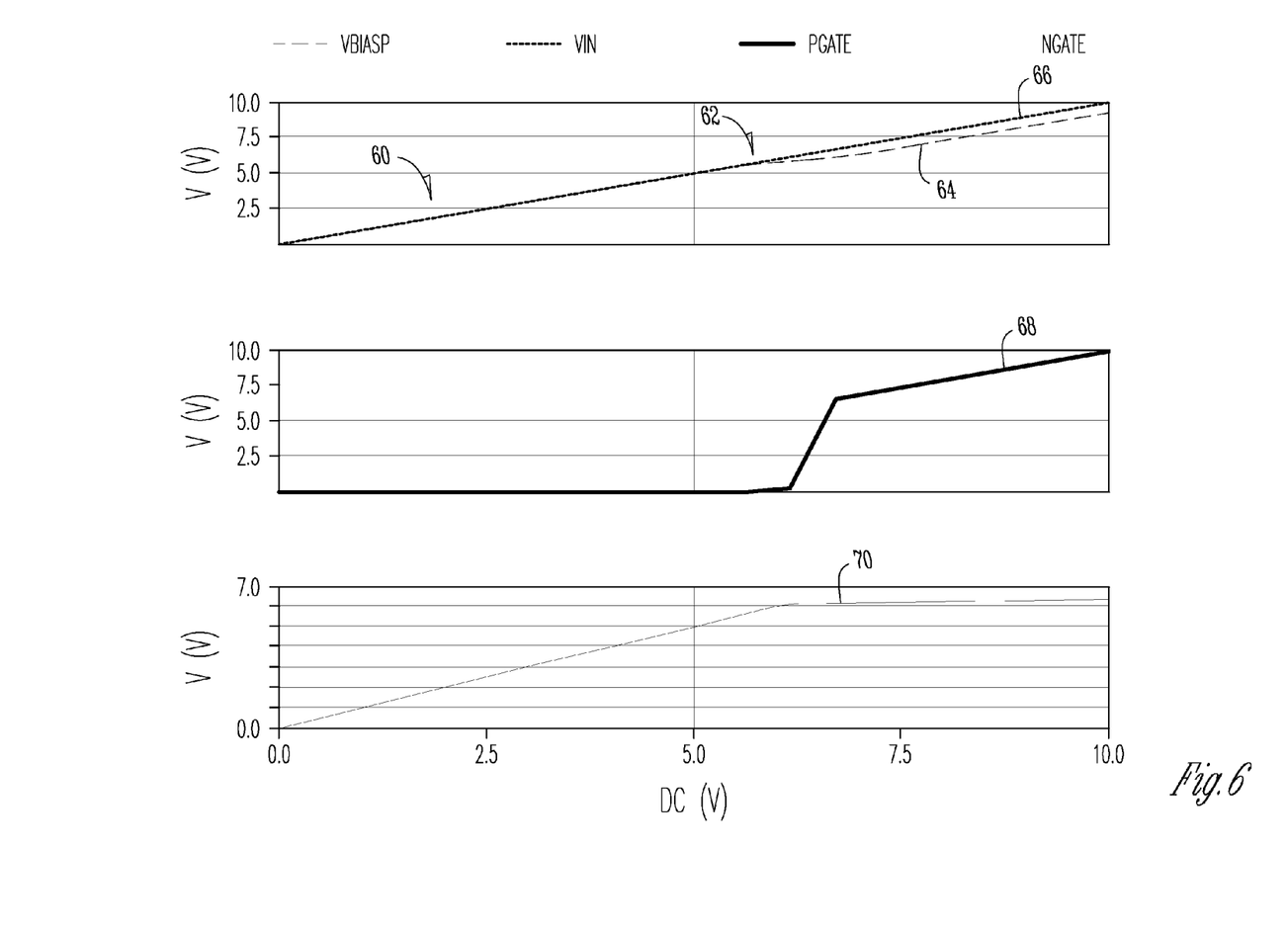
FIG. 6 depicts three graphs related to the operation of the example circuit diagram of FIG. 2.

FIG. 6 depicts three graphs related to the operation of the example circuit diagram of FIG. 2. More particularly, the three graphs of FIG. 6 depict the voltages at several internal nodes in the circuit of FIG. 2.

The top graph in FIG. 6 depicts the voltage 64 at the node labeled vbiasp in FIG. 2 (connected to the gate terminal of the transistor MP0) and the input voltage 66. The y-axis represents the voltage 64 in volts at the node labeled vbiasp and the x-axis represents the input voltage 66 in volts. The middle graph in FIG. 6 depicts the voltage 68 at the node labeled pgate in FIG. 2 (connected to the gate terminal of the transistor MP1). The y-axis represents the voltage 68 in volts at the node labeled pgate and the x-axis represents the input voltage in volts. The bottom graph in FIG. 6 depicts the voltage at the node labeled ngate in FIG. 2 (connected to the gate terminal of the transistor MN0). The y-axis represents the voltage 70 in volts at the node labeled ngate and the x-axis represents the input voltage in volts.

As seen in the top graph, the voltage 64 on the node labeled vbiasp initially tracks the input voltage 66 as the input voltage 66 increases from 0 V, as shown at 60. Once the input voltage 66 reaches the reverse breakdown voltage of the zener diode Z1 (FIG. 2), shown at 62 in the top graph of FIG. 6, the voltage 64 on the node labeled vbiasp is less than the input voltage 66 due to the voltage drop across the resistor stack $R_s$ (FIG. 2). This sets up a Vgs on the transistor MP0, which places the transistor MP0 in an ON-state.

When the transistor MP0 is placed in an ON-state, the voltage 68 at the node labeled pgate can be pulled up from a ground voltage (e.g., about 0 V) to the input voltage, as shown in the middle graph in FIG. 6. Once the transistor MP0 is placed in an ON-state, the voltage 68 at the node labeled pgate can track the input voltage. In other words, the voltage 68 at the node labeled pgate in the middle graph will be substantially the same as the input voltage 66 in the top graph after the zener diode Z1 breaks down.

The bottom graph depicts the voltage 70 at the node labeled ngate, which can be connected to the gate terminal of the transistor MN0. The voltage 70 at the node labeled ngate can determine the final output voltage. The voltage 70 at the node labeled ngate can determine the final output voltage as the input voltage increases, until the input voltage reaches the reverse breakdown voltage of the zener diode Z1 (FIG. 2). Once the zener diode Z1 biases, the voltage 70 at the node labeled ngate plateaus even as the input voltage continues to increase. The voltage at the output terminal 26 is a threshold voltage less than the voltage at the node labeled ngate.

The techniques described above can have many applications. For instance, the voltage clamp circuit 20 of FIG. 2 can form part of a load switch design to protect peripheral circuitry connected to the load switch. The high voltage transistors MN0 and MP1 can allow the clamp circuit 20 to tolerate high voltages (e.g., voltages greater than 7 V for 5 V MOS devices), which protect detection circuits that will open the load switch to protect the peripheral circuitry. In addition to load switches, the clamp circuit 20 can be used in conjunction with Universal Serial Bus (USB) charger detection, as well as USB switches and audio switches, for example.

ADDITIONAL NOTES AND EXAMPLES

In Example 1, a voltage clamp circuit comprises an input terminal configured to receive an input voltage, an output terminal configured to output an output voltage, a first controllable switch connected between the input terminal and the output terminal, the first controllable switch configured to control the output voltage at the output terminal for a first range of input voltages at the input terminal, and a second controllable switch connected between the input terminal and the output terminal, the second controllable switch configured to control the output voltage at the output terminal for a second range of input voltages at the input terminal, where the second range of input voltages is greater than the first range of input voltages, where the output voltage equals the input voltage for at least a portion of the first range of input voltages, and where the output voltage is less than the input voltage for at least a portion of the second range of input voltages.

In Example 2, the first controllable switch of the clamp circuit of Example 1 is optionally a p-type transistor and the second controllable switch is optionally an n-type transistor.

In Example 3, the first controllable switch of any one or more of Examples 1-2 has a control terminal, and the clamp circuit of any one or more of Examples 1-2 optionally further comprises at least one resistor, and a first zener diode connected in series with the at least one resistor, the first zener diode having a reverse breakdown voltage, wherein when a voltage across the first zener diode exceeds the reverse breakdown voltage, the first zener diode is configured to conduct current through the at least one resistor and apply a voltage at the control terminal of the first controllable switch.

In Example 4, the voltage clamp circuit of any one or more of Examples 1-3 optionally further comprises a third controllable switch connected between the input terminal and the first controllable switch, the third controllable switch configured to control the first controllable switch.

In Example 5, in the voltage clamp circuit of any one or more of Examples 1-4, the third controllable switch is optionally configured as a p-type transistor, the third controllable switch comprises a source terminal, a drain terminal, and a gate terminal, and the clamp circuit of any one or more of Examples 1-4 optionally further comprises a second zener diode connected between the gate terminal and the drain terminal of the third controllable switch, the second zener diode having a reverse breakdown voltage, wherein the second zener diode is configured to conduct current if a voltage on the gate terminal exceeds a voltage on the drain terminal by the reverse breakdown voltage.

In Example 6, the voltage clamp circuit of any one or more of Examples 1-5 optionally further comprises a ground voltage terminal, and a third zener diode connected between the output terminal and the ground voltage terminal, the third zener diode having a reverse breakdown voltage, wherein when a voltage across the third zener diode exceeds the reverse breakdown voltage, the third zener diode is configured to conduct current and maintain the output voltage at a substantially constant voltage that is less than the input voltage.

In Example 7, a device comprises a voltage clamp circuit including an input terminal configured to receive an input voltage, an output terminal configured to output an output voltage, a first controllable switch connected between the input terminal and the output terminal, the first controllable switch configured to control the output voltage at the output terminal for a first range of input voltages at the input terminal, a second controllable switch connected between the input terminal and the output terminal, the second controllable switch configured to control the output voltage at the output terminal for a second range of input voltages at the input terminal, wherein the second range of input voltages is greater than the first range of input voltages, wherein the output voltage equals the input voltage for at least a portion of the first range of input voltages, and wherein the output voltage is less than the input voltage for at least a portion of the second range of input voltages.

In Example 8, the first controllable switch of Example 7 is optionally configured as a p-type transistor and the second controllable switch is optionally configured as an n-type transistor.

In Example 9, the first controllable switch of either or both Examples 7 and 8 has a control terminal, and the circuit optionally further comprises at least one resistor, and a first zener diode connected in series with the at least one resistor, the first zener diode having a reverse breakdown voltage, wherein when a voltage across the first zener diode exceeds the reverse breakdown voltage, the first zener diode is configured to conduct current through the at least one resistor and apply a voltage at the control terminal of the first controllable switch.

In Example 10, the device of any one or more of Examples 7-9 further comprises a third controllable switch connected between the input terminal and the first controllable switch, the third controllable switch configured to control the first controllable switch.

In Example 11, the third controllable switch of any one or more of Examples 7-10 is optionally configured as a p-type transistor, wherein the third controllable switch comprises a source terminal, a drain terminal, and a gate terminal, and the clamp circuit of any one or more of Examples 7-10 optionally further comprises a second zener diode connected between the gate terminal and the drain terminal of the third controllable switch, the second zener diode having a reverse breakdown voltage, wherein the second zener diode is configured to conduct current if a voltage on the gate terminal exceeds a voltage on the drain terminal by the reverse breakdown voltage.

In Example 12, the device of any one or more of Examples 7-11 optionally further comprises a ground voltage terminal and a third zener diode connected between the output terminal and the ground voltage terminal, the third zener diode having a reverse breakdown voltage, wherein when a voltage across the third zener diode exceeds the reverse breakdown voltage, the third zener diode is configured to conduct current and maintain the output voltage at a substantially constant voltage that is less than the input voltage.

In Example 13, the device of any one or more of Examples 7-11 is optionally configured as a load switch.

In Example 14, a method of clamping an output voltage comprises controlling, via a first controllable switch connected between an input terminal and an output terminal, an output voltage at the output terminal for a first range of input voltages at the input terminal, controlling, via a second controllable switch connected between the input terminal and the output terminal, the output voltage at the output terminal for a second range of input voltages at the input terminal, wherein the second range of voltages is greater than the first range of input voltages, wherein the output voltage equals the input voltage for at least a portion of the first range of input voltages, and wherein the output voltage is less than the input voltage for at least a portion of the second range of input voltages.

In Example 15, the first controllable switch of Example 14 is optionally configured as a p-type transistor and the second controllable switch is optionally configured as an n-type transistor.

In Example 16, the first controllable switch of any one or more of Examples 14-15 has a control terminal, and the method of any one or more of Examples 14-15 optionally further comprises applying a voltage at the control terminal of the first controllable switch when a voltage across a first zener diode exceeds a reverse breakdown voltage of the first zener diode, wherein the voltage is at least partially determined by at least one resistor connected in series with the first zener diode.

In Example 17, the method of any one or more of Examples 14-16 optionally further comprises controlling the first controllable switch via a third controllable switch connected between the input terminal and the first controllable switch.

In Example 18, the third controllable switch of any one or more of Examples 14-17 is a p-type transistor, wherein the third controllable switch comprises a source terminal, a drain terminal, and a gate terminal, the method of any one or more of Examples 14-17 optionally further comprises controlling a maximum voltage between the gate terminal and the drain terminal of the third controllable switch.

In Example 19, the method of any one or more of Examples 14-18 optionally further comprises controlling a maximum voltage at the output terminal to prevent a voltage overshoot.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A voltage clamp circuit comprising:
    an input terminal configured to receive an input voltage;
    an output terminal configured to output an output voltage;
    a ground voltage terminal;
    a first controllable switch connected between the input terminal and the output terminal, the first controllable switch configured to output a first voltage to the output terminal for a first range of input voltages at the input terminal;
    a second controllable switch connected between the input terminal and the output terminal, the second controllable switch configured to output a second voltage to the output terminal for a second range of input voltages at the input terminal;
    a first zener diode connected between the output terminal and the ground voltage terminal, the first zener diode having a reverse breakdown voltage,
    wherein when a voltage across the first zener diode exceeds the reverse breakdown voltage, the first zener diode is configured to conduct current and maintain the output voltage at a substantially constant voltage that is less than the input voltage, wherein the second range of input voltages is greater than the first range of input voltages, wherein the first output voltage equals the input voltage for at least a portion of the first range of input voltages, and wherein the second output voltage is less than the input voltage for at least a portion of the second range of input voltages.

2. The voltage clamp circuit of claim 1, wherein the first controllable switch is a p-type transistor and the second controllable switch is an n-type transistor.

3. The voltage clamp circuit of claim 1, wherein the first controllable switch has a control terminal, the circuit further comprising:
at least one resistor; and
a second zener diode connected in series with the at least one resistor, the second zener diode having a reverse breakdown voltage,
wherein when a voltage across the second zener diode exceeds the reverse breakdown voltage, the second zener diode is configured to conduct current through the at least one resistor and apply a voltage at the control terminal of the first controllable switch.

4. The voltage clamp circuit of claim 1, further comprising:
a third controllable switch configured to control the first controllable switch, wherein the third controllable switch comprises a source terminal, a drain terminal, and a gate terminal;
a third zener diode connected between the gate terminal and the drain terminal of the third controllable switch, the third zener diode having a reverse breakdown voltage,
wherein the third zener diode is configured to conduct current if a voltage on the gate terminal exceeds a voltage on the drain terminal by the reverse breakdown voltage.

5. The voltage clamp circuit of claim 4, wherein the third controllable switch is a p-type transistor.

6. The voltage clamp of claim 1, wherein the first range is between about zero and six volts and the second range is between about six and ten volts.

7. A voltage clamp circuit comprising:
an input terminal configured to receive an input voltage;
an output terminal configured to output an output voltage;
a first controllable switch connected between the input terminal and the output terminal, the first controllable switch configured to output a first voltage to the output terminal for a first range of input voltages at the input terminal;
a second controllable switch connected between the input terminal and the output terminal, the second controllable switch configured to output a second voltage to the output terminal for a second range of input voltages at the input terminal;
a third controllable switch configured to control the first controllable switch;
a first zener diode connected between the gate terminal and the drain terminal of the third controllable switch, the third zener diode having a reverse breakdown voltage,
wherein the third controllable switch comprises a source terminal, a drain terminal, and a gate terminal,
wherein the third zener diode is configured to conduct current if a voltage on the gate terminal exceeds a voltage on the drain terminal by the reverse breakdown voltage,
wherein the second range of input voltages is greater than the first range of input voltages, wherein the first output voltage equals the input voltage for at least a portion of the first range of input voltages, and wherein the second output voltage is less than the input voltage for at least a portion of the second range of input voltages.

8. The device of claim 7, wherein the first controllable switch is a p-type transistor and the second controllable switch is an n-type transistor.

9. The device of claim 7, wherein the first controllable switch has a control terminal, the circuit further comprising:
at least one resistor; and
a second zener diode connected in series with the at least one resistor, the second zener diode having a reverse breakdown voltage,
wherein when a voltage across the second zener diode exceeds the reverse breakdown voltage, the second zener diode is configured to conduct current through the at least one resistor and apply a voltage at the control terminal of the first controllable switch.

10. The device of claim 7, wherein the third controllable switch is a p-type transistor.

11. The device of claim 7, further comprising:
a ground voltage terminal; and
a third zener diode connected between the output terminal and the ground voltage terminal, the third zener diode having a reverse breakdown voltage,
wherein when a voltage across the third zener diode exceeds the reverse breakdown voltage, the third zener diode is configured to conduct current and maintain the output voltage at a substantially constant voltage that is less than the input voltage.

12. The voltage clamp of claim 7, wherein the first range is between about zero and six volts and the second range is between about six and ten volts.

13. A method of clamping an output voltage, the method comprising:
controlling, via a first controllable switch connected between an input terminal and an output terminal, an output voltage at the output terminal for a first range of input voltages at the input terminal;
controlling, via a second controllable switch connected between the input terminal and the output terminal, the output voltage at the output terminal for a second range of input voltages at the input terminal;
controlling, via a first zener diode connected between the output terminal and a ground voltage terminal, a maximum voltage at the output terminal to prevent a voltage overshoot,
wherein the second range of voltages is greater than the first range of input voltages,
wherein the output voltage equals the input voltage for at least a portion of the first range of input voltages, and
wherein the output voltage is less than the input voltage for at least a portion of the second range of input voltages.

14. The method of claim 13, wherein the first controllable switch is a p-type transistor and the second controllable switch is an n-type transistor.

15. The method of claim 13, wherein the first controllable switch has a control terminal, the method further comprising:
applying a voltage at the control terminal of the first controllable switch when a voltage across a second zener diode exceeds a reverse breakdown voltage of the second zener diode, wherein the voltage is at least partially determined by at least one resistor connected in series with the second zener diode.

16. The method of claim 13, further comprising:
controlling the first controllable switch via a third controllable switch connected between the input terminal and the first controllable switch.

17. The method of claim 16, wherein the third controllable switch is a p-type transistor, wherein the third controllable switch comprises a source terminal, a drain terminal, and a gate terminal, the method further comprising:
controlling a maximum voltage between the gate terminal and the drain terminal of the third controllable switch.

18. The method of claim 13, wherein the first range is between about zero and six volts and the second range is between about six and ten volts.

\* \* \* \* \*